(12) United States Patent
Kawabe

(10) Patent No.: US 8,093,506 B2
(45) Date of Patent: Jan. 10, 2012

(54) MULTILAYER WIRING BOARD AND POWER SUPPLY STRUCTURE TO BE EMBEDDED IN MULTILAYER WIRING BOARD

(75) Inventor: Tadahiko Kawabe, Gufu (JP)

(73) Assignee: NGK Spark Plug Co., Ltd., Aichi (JP)

( * ) Notice: Subject to any disclaimer, the term of this patent is extended or adjusted under 35 U.S.C. 154(b) by 1071 days.

(21) Appl. No.: 11/944,784

(22) Filed: Nov. 26, 2007

(65) Prior Publication Data

US 2008/0149384 A1 Jun. 26, 2008

(30) Foreign Application Priority Data

Dec. 21, 2006 (JP) ................................ 2006-344061

(51) Int. Cl.
*H05K 1/11* (2006.01)
(52) U.S. Cl. ........ 174/262; 174/264; 174/265; 174/266; 361/763; 361/764; 361/765; 361/784
(58) Field of Classification Search .................. 174/262, 174/264–266; 361/763–765, 784
See application file for complete search history.

(56) References Cited

U.S. PATENT DOCUMENTS

| 5,110,300 | A | * | 5/1992 | Woodgate | ............... | 439/121 |
| 7,696,442 | B2 | * | 4/2010 | Muramatsu et al. | ........... | 174/260 |
| 2007/0117338 | A1 | * | 5/2007 | Yamamoto et al. | ............ | 438/396 |

FOREIGN PATENT DOCUMENTS

| JP | 7-50487 | 2/1995 |
| JP | 11-17341 | 1/1999 |

* cited by examiner

*Primary Examiner* — Yuriy Semenenko
*Assistant Examiner* — Andargie M Aychillhum
(74) *Attorney, Agent, or Firm* — Kusner & Jaffe

(57) ABSTRACT

A multilayer wiring board capable of feeding sufficient electric power to a circuit element, such as an IC chip. In one embodiment of the present invention, a multilayer wiring board is comprised of: a core board; a build up layer disposed on an upper surface of the core board; a build up layer disposed on a lower surface of the core board; and a power supply structure embedded in a through hole penetrating the core board and the build up layers. The power supply structure is comprised of: a conductive metal rod made of copper as a main material; a conductive metal tube made of copper as a main material and provided coaxially with the conductive metal rod; and an insulating material filling a gap between the conductive metal rod and the conductive metal tube.

13 Claims, 8 Drawing Sheets

MULTILAYER WIRING BOARD AND POWER SUPPLY STRUCTURE TO BE EMBEDDED IN MULTILAYER WIRING BOARD

FIELD OF THE INVENTION

The present invention relates to a multilayer wiring board for mounting an IC chip or the like and a power supply structure to be embedded in the multilayer wiring board.

BACKGROUND OF THE INVENTION

In recent years, the semiconductor integrated circuit elements (IC chips) used for a CPU in a computer or the like operate at higher speeds, and with higher level functional features, than previously. Along with this advance, the number of terminals has increased and the terminal interval has tended to be narrower. Generally speaking, terminals in large numbers are densely packed on the bottom surface of the IC chip in an array, and a terminal block so formed is connected to a terminal block at the motherboard side by a "flip chip" connection. However, because there is a large difference in pitch between the terminal block at the IC chip side and the terminal block at the motherboard side, it is difficult to directly connect the IC chip to the motherboard. Therefore, the connection method generally employed is one wherein the IC chip is first mounted on a multilayer wiring board and the multilayer wiring board is mounted on the motherboard. Examples of such multilayer wiring boards for mounting the IC chip include a wiring board wherein a core board made of polymer material is formed and build up layers are formed on a top surface and a rear surface of the core board.

FIG. 12 is a schematic sectional view showing a conventional multilayer wiring board.

A multilayer wiring board 100 for mounting an IC chip is comprised of a plate-like core board 101 made of glass epoxy, a buildup layer 102 formed on an upper surface of the core board 101 and a build up layer 103 formed on a lower surface of the core board 101.

The build up layer 102 has a structure in which resin insulating layers 107 made of epoxy resin (i.e., interlayer insulating layer) and conductor layers 108 made of copper are alternately laminated, and an IC chip 110 (semiconductor integrated circuit element) is mounted on the build up layer 102. Similarly, the build up layer 103 has a structure in which resin insulating layers 111 and conductor layers 112 are alternately laminated. The multilayer wiring board 100 is connected to a motherboard 114 through the build up layer 103.

The core board 101 includes a plurality of through hole conductors 116 so that an upper surface and a lower surface of the core board 101 communicate with each other. The through hole conductors 116 are formed by a copper plating, and a hole defined by the through hole conductors 116 is filled with, for example, a plugging body 117, such as an epoxy resin. The through hole conductor 116 is connected to a conductor layers 108, 112 of the build up layers 102, 103. A signal transfer and power supply are conducted between a motherboard 114 and the IC chip 110 through the conductor layers 108, 112 and the through hole conductors 116.

In the multilayer wiring board 100, a through hole conductor 118 for a power supply which penetrates the core board 101 and the build up layers 102, 103 is provided in a peripheral portion of the multilayer wiring board 100. The through hole conductor 118 is formed by a copper plating, and a hole defined by the through hole conductors 18 is filled with, for example, a plugging body 119, such as an epoxy resin.

Japanese Patent Application Laid-Open (kokai) No. H7-50487 (patent document 1) discloses a multilayer wiring board comprised of an inner layer board and an outer layer board, wherein a through hole penetrating the inner layer board and outer layer board is plated by copper. Further, Japanese Patent Application Laid-Open (kokai) No. H11-17341 (patent document 2) discloses a multilayer wiring board comprised of a core material and a copper-clad lamination base material, wherein a through hole penetrating the core material and the copper-clad lamination base material is filled with a conductive paste.

In order for a wiring board 100 to mount an IC 110 chip which operates at higher speeds with high level functional features, it is necessary for the wiring board 100 to supply more electric power to the IC chip 110. However, conventional through hole conductors 116, 118 are formed by applying a copper plating to a through hole. The electric current only flows on an inner circumference face of the through hole. Further, in order to attain a miniaturization of the multilayer wiring board 100, the diameter of the through hole conductor 116, 118 cannot be increased, thereby limiting power supply capacity. Furthermore, although it is possible to increase the power supply capacity by filling a conductive paste (as disclosed in patent document 2) into the through hole to which the copper is plated (as mentioned in patent document 1), the conductive paste has a relatively large electrical resistance, and thus sufficient power supply capacity cannot be secured.

In order to supply high current to the IC chip 110, the number of through hole conductors 116, 118 can be increased. However, it is difficult to secure a space for signal wiring with this method. Thus, another method for securing the sufficient power supply capacity is in demand.

The present invention has been achieved in view of the above problems of the prior art, and an object of the invention is to provide a multilayer wiring board capable of supplying enough electric power to a circuit element, such as an IC chip, and to provide a power supply structure to be embedded in the multilayer wiring board.

SUMMARY OF THE INVENTION

To solve the above-described problems, in accordance with a first aspect (aspect 1) of the invention, there is provided a multilayer wiring board comprising: a core board having a main surface and a rear surface; a first laminated wiring portion having a structure in which a plurality of main surface side insulating layers and a plurality of main surface side conductor layers are alternately laminated on the main surface, and an element mounting portion is provided on a surface of the first laminated wiring portion; a second laminated wiring portion having a structure in which a plurality of rear surface side insulating layers and a plurality of rear surface side conductor layers are alternately laminated on the rear surface; a through hole conductor formed in the core board and electrically connecting the main surface side conductor layer and the rear surface side conductor layer; and a power supply structure comprised of a conductive metal member which is made of copper as a main material and embedded in a through hole which penetrates the first laminated wiring portion, the core board and the second laminated wiring portion, wherein the conductive metal member is electrically connected to the main surface side conductor layer for the power supply and the rear surface side conductor layer for the power supply, respectively.

Thus, according to the multilayer wiring board of aspect 1, the power supply structure is embedded in the through hole which penetrates the first laminated wiring portion, the core board and the second laminated wiring portion. The power supply structure is comprised of a conductive metal member made of copper as a main material and is electrically connected to the main surface side conductor layer for the power supply and the rear surface side conductor layer for the power supply, respectively. Since the conductive metal member has a low resistance compared to that of a hardened material of a conductive paste, high current can be supplied. Thus, sufficiently large power can be supplied to a circuit element mounted on the element mounting portion.

The power supply structure is preferably comprised of a conductive metal rod made of copper as a main material. A rod-like shaped member such as the conductive metal rod can be easily inserted into the through hole penetrating the first laminated wiring portion, the core board and the second laminated wiring portion. Further, nickel (Ni) or gold (Au) plating or the like is preferably applied to the surface of the conductive metal rod, which is made of copper as a main material. This composition can prevent not only an oxidization of the conductive metal rod, but also reduce the electrical resistance thereof. Furthermore, the solder, which is used for connecting the power supply structure to the main surface side conductor layer and the rear surface side conductor layer for the power supply, has improved wettability. Accordingly, a reliable electric connection to the main surface side conductor layer for the power supply and the rear surface side conductor layer for the power supply can be achieved.

The power supply structure is preferably comprised of the conductive metal rod made of copper as a main material, a conductive metal tube provided coaxially with the conductive metal rod and made of copper as a main material, and an insulating material which fills a gap between the conductive metal rod and the conductive metal tube. With this composition, the conductive metal rod and the conductive metal tube of the power supply structure can form two current paths, thereby enabling the supply of high current.

Here, the power supply structure at least has a lower resistance than that of the through hole conductor. More particularly, the resistance of the power supply structure is preferably 3 µohm/cm² or less. When the power supply structure has a resistance of 3 µohm/cm² or less, there is an advantage that high power can be sufficiently supplied while avoiding an increase in a diameter of the power supply structure. As mentioned above, when the power supply structure is comprised of the conductive metal rod and the conductive metal tube, each resistance thereof is preferably 3 µohm/cm² or less.

A main surface side end portion of the conductive metal rod is electrically connected to the main surface side conductor layer for the power supply. A rear surface side end portion of the conductive metal rod is electrically connected to the rear surface side conductor layer for the power supply. A main surface side end portion of the conductive metal tube is electrically connected to a main surface side conductor layer for a ground. A rear surface side end portion of the conductive metal tube is electrically connected to a rear surface side conductor layer for the ground. With this composition, since the conductive metal rod for the power supply is shielded by the conductive metal tube for the ground, a power-supply noise generated at the time of power supply can be reduced whereby the circuit element mounted on the element mounting portion can be reliably operated.

The conductive metal tube preferably has a notch formed at least in one of the main surface side end portion and the rear surface side end portion thereof, and at least one of the main surface side conductor layer and the rear surface side conductor layer for the power supply is preferably laid in a location where the notch is formed. With this composition, the conductor layer for the power supply is not in contact with the conductive metal tube for the ground. Thus, the conductor layer for the power supply can be reliably connected to the conductive metal rod provided inside the conductive metal tube.

The conductive metal tube preferably has a flange-like or a tab-like pad portion at least in one of the main surface side end portion and the rear surface side end portion. The pad portion is preferably electrically connected to at least one of the main surface side conductor layer and the rear surface side conductor layer for the ground. With this arrangement, the conductor layer for the ground is easily and reliably connected to the pad portion formed in an end portion of the conductive metal tube. Further, when the power supply structure is inserted in the through hole, the pad portion of the conductive metal tube is caught in an opening of the through hole whereby the power supply structure can be securely held. As a result, the connection reliability of the power supply structure can improve.

The element mounting portion is preferably provided in a generally center area of the core board, and the power supply structure is preferably provided at plural locations in the outer circumference portion of the core board. With this arrangement, since the plural power supply structures are provided in the locations where no element mounting portion formed in the generally center area of the core board is provided, the area for the element mounting portion is fully secured. Further, the power supply structures are provided in plural locations, thereby reliably feeding the power to the circuit element mounted on the element mounting portion. More particularly, the power supply structure is preferably provided in the positions corresponding to four corners of the element mounting portion which is changeable, for example, according to a shape of the IC chip.

The material for forming the core board is not particularly limited, but suitable materials can be selected in consideration of cost, machinability, insulation property, mechanical strength, or the like. The preferred core board includes, for example, a resin board, a ceramic board, a metal board or the like. As specific examples of the resin substrate, there are EP resin (epoxy resin) board, PI resin (polyimide resin) board, a BT resin (bismaleimide triazine resin) board, a PPE resin (polyphenylene ether resin) board, or the like. In addition, it is possible to use a substrate which is comprised of a composite material made of these resin and glass fibers (a glass woven fabric and a glass nonwoven fabric) or organic fibers, such as polyamide fibers. Alternatively, a substrate or the like made of a resin-resin composite material may be used, which is formed by way of impregnating a thermosetting resin, such as an epoxy resin with a three-dimensional meshes-like fluororesin base material, such as a continuous porous PTFE. Specific examples of the ceramic substrate include a substrate which is comprised of low-temperature firing materials, such as an alumina board, a beryllia board, a glass ceramic board, and a crystallized glass. Specific examples of the metal substrate include, for example, a copper board, a copper alloy board, a substrate comprising a single metal substance other than copper, a substrate made of an alloy other than copper alloy or the like.

Further, the above-mentioned core board may be a substrate in which a wiring layer is formed therein, or a substrate in which an electronic component, such as a chip capacitor or a chip resistor, is embedded therein.

Examples of the circuit element mounted on the above-mentioned element mounting portion include an IC chip serving as a CPU, GPU or chipset, or an IC chip for graphics, servers, routers or the like.

As another aspect (aspect 2) for solving the above-mentioned problems, there is provided a power supply structure to be embedded in a multilayer wiring board comprising: a conductive metal rod made of copper as a main material; a conductive metal tube provided coaxially with the conductive metal rod and made of copper as a main material; and an insulating material which fills a gap between the conductive metal rod and the conductive metal tube.

According to aspect 2 of the invention, the conductive metal rod and the conductive metal tube of the power supply structure can form two current paths. As a result, high current can be supplied through embedding the power supply structure in a through hole of the multilayer wiring board.

The conductive metal tube of the power supply structure to be embedded in the multilayer wiring board preferably has a notch formed at least in one of the main surface side end portion and the rear surface side end portion thereof. With this arrangement, the conductor layer formed in the multilayer wiring board is not in contact with the conductive metal tube. Thus, the conductor layer can be reliably connected to the conductive metal rod provided inside the conductive metal tube.

The conductive metal tube of the power supply structure to be embedded in the multilayer wiring board preferably has a flange-like or a tab-like pad portion at least in one of the main surface side end portion and the rear surface side end portion thereof. With this composition, the conductor layer of the multilayer wiring board is easily and reliably connected to the pad portion formed in an end portion of the conductive metal tube. Further, when the power supply structure is inserted in the through hole, the pad portion of the conductive metal tube is caught in an opening of the through hole whereby the power supply structure can be securely held. As a result, the connection reliability of the power supply structure can improve.

Hereafter, a method for manufacturing the multilayer wiring board will be described.

In a preparing step, the core board having the main surface side conductor layer, the rear surface side conductor layer and the through hole conductors penetrating each conductor layer is produced by conventionally known techniques, and is prepared in advance. The power supply structure including conductive metal members made of copper is produced by conventionally known techniques, and is prepared in advance.

In a laminated wiring portion formation step, the first laminated wiring portion in which the main surface side insulating layer and the main surface side conductor layer are alternately laminated is formed on the main surface of the core board by conventionally known techniques. Further, the second laminated wiring portion in which the rear surface side insulating layer and the rear surface side conductor layer are alternately laminated is formed on the rear surface of the core board.

Thereafter, in an embedding step of the power supply structure, the through hole which penetrates the first laminated wiring portion, the core board and the second laminated wiring portion is formed, and the power supply structure is embedded therein. Thereafter, the conductor layers connected to the conductive metal member of the power supply structure are formed, and finally, covered with a solder resist.

Figure 1:
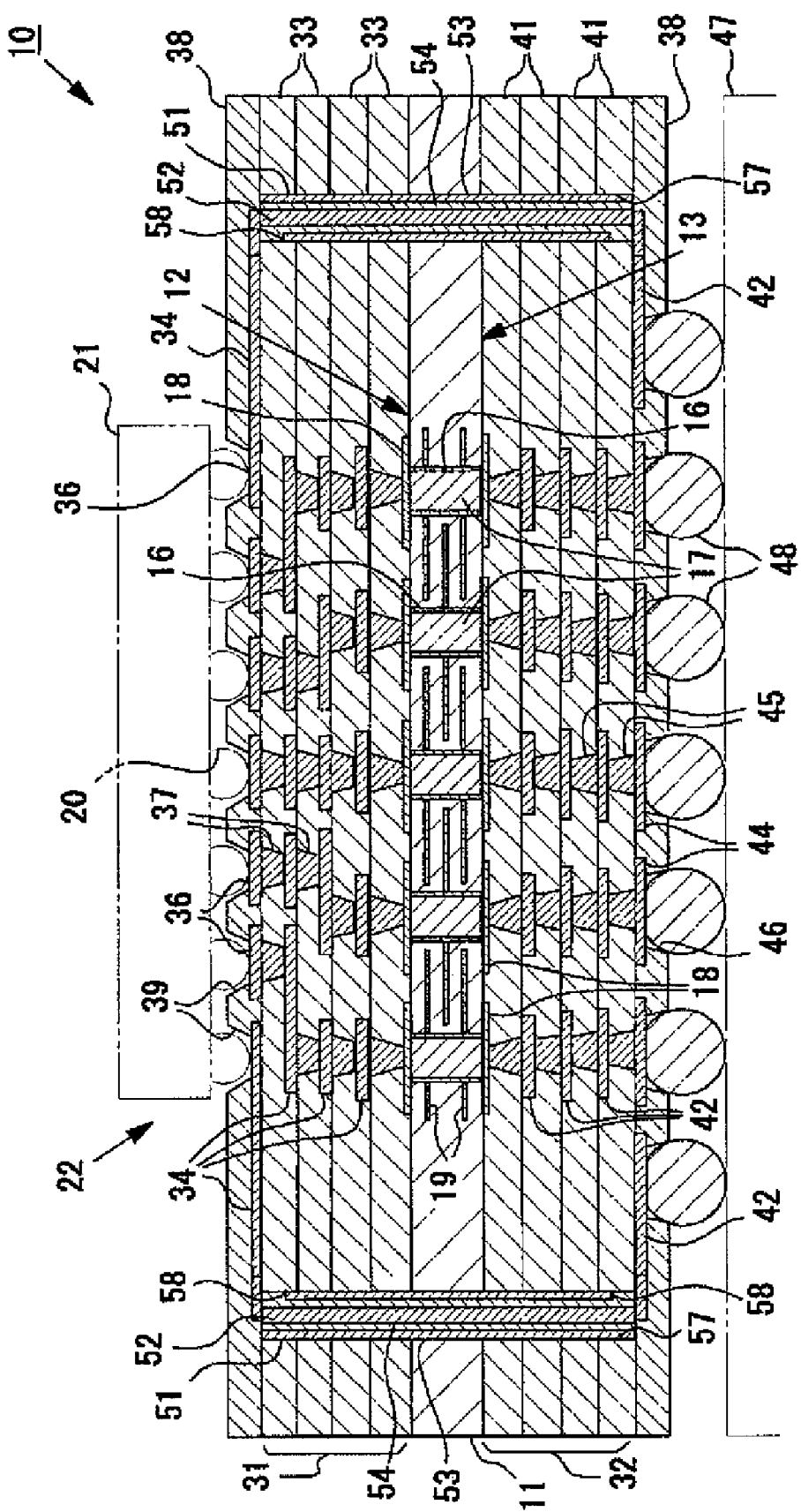
FIG. 1 is a schematic sectional view showing a multilayer wiring board embodying an embodiment of the invention.

DESCRIPTION OF REFERENCE NUMERALS 10, 61: multilayer wiring board
11: core board
12: upper surface serving as a main surface
13: lower surface serving as a rear surface
16: through hole conductor
22: element mounting portion
31: build up layer serving as a first laminated wiring portion
32: build up layer serving as a second laminated wiring portion
33: resin insulating layer serving as a main surface side insulating layer
34: conductor layer serving as a main surface side conductor layer
41: resin insulating layer serving as a rear surface side insulating layer
42: conductor layer serving as a rear surface side conductor layer
51, 63: power supply structure
52, 62: conductive metal rod
53: conductive metal tube
54: insulating material
57: through hole
58: notch
59, 64: pad portion

DETAILED DESCRIPTION OF THE INVENTION

An embodiment for carrying out a multilayer wiring board of the present invention will be described in detail with reference to the drawings. FIG. 1 is a schematic sectional view showing a multilayer wiring board 10 according to an embodiment of the invention.

As shown in FIG. 1, the multilayer wiring board 10 is a wiring board for mounting an IC chip thereon and is comprised of: a generally rectangular core board 11 made of glass epoxy; a build up layer 31 (first laminated wiring portion) formed on an upper surface 12 (main surface) of the core board 11; and a build up layer 32 (second laminated wiring portion) formed on a lower surface 13 (rear surface) of the core board 11. Through hole conductors 16 are formed at a plurality of locations in the core board 11. These through hole conductors 16 are formed by applying a copper plating to an inner circumference of a through hole to thereby electrically connect the upper surface 12 and the lower surface 13 of the core board 11. It is noted that the inside of each through hole conductor 16 is filled with a plugging body 17 such as an epoxy resin. Conductor layers 18 made of copper are pattern-formed on the upper surface 12 and the lower surface 13 of the core board 11, and each conductor layer 18 is electrically connected to the through hole conductor 16. Furthermore, conductor layers 19 made of copper are formed inside of the core board 11, and each conductor layer 19 is electrically connected to the through hole conductor 16.

The build up layer 31 formed on the upper surface 12 of the core board 11 has a structure in which resin insulating layers 33 (main surface side insulating layers) made of an epoxy resin and conductor layers 34 (main surface side conductor layers) made of copper are alternately laminated. Terminal pads 36 are formed in a plurality of positions on an uppermost surface of the resin insulating layers 33 in the form of an array. The terminal pads 36 are electrically connected to the conductor layer 18 of the upper surface 12 of the core board 11 through via conductors 37 and the conductor layer 34 formed in the build up layer 31. The surface of the resin insulating layer 33 is almost entirely covered with a solder resist 38. Openings 39 for exposing the terminal pads 36 are formed in predetermined positions of the solder resist 38. The terminal pads 36 are electrically connected to an IC chip 21 (a semiconductor integrated circuit element) via a plurality of solder bumps 20. Each terminal pad 36 is provided in a generally center area on the core board 11, and this center area serves as an element mounting portion 22.

The build up layer 32 formed on the lower surface 13 of the core board 11 has nearly the same structure as the build up layer 31 mentioned above. That is, the build up layer 32 has a structure in which resin insulating layers 41 (rear surface side insulating layers) made of an epoxy resin and conductor layers 42 (rear surface side conductor layer) are alternately laminated. BGA pads 44 are formed in a plurality of positions on a lowermost surface of the resin insulating layers 33 in the form of a lattice. The BGA pads 44 are electrically connected to the conductor layer 18 of the lower surface 13 of the core board 11 through via conductors 45 and the conductor layers 42 formed in the build up layer 32. A lower surface of the resin insulating layer 41 is almost entirely covered with the solder resist 38. Openings 46 for exposing the BGA pads 44 are formed in predetermined positions in the solder resist 38. A plurality of solder bumps 48 for establishing electrical connection to a motherboard 47 is respectively provided on the surface of BGA pads 44. The multilayer wiring board 10 is mounted on the motherboard 47 by means of each solder bump 48.

Figure 2:
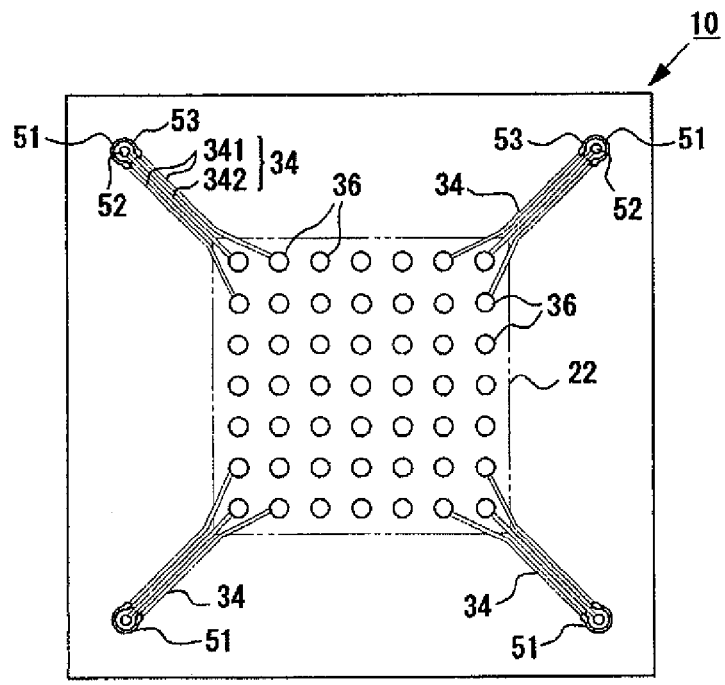
FIG. 2 is a plan view showing a multilayer wiring board according to an embodiment of the invention.
Figure 3:
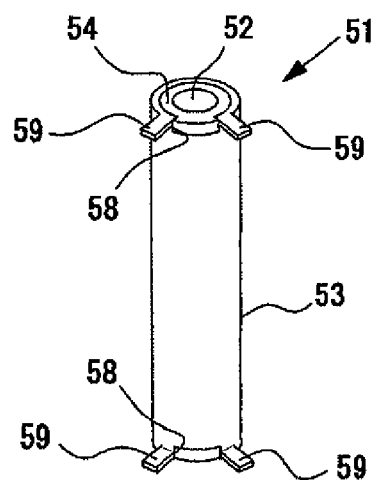
FIG. 3 is a perspective view showing a power supply structure according to an embodiment of the invention.

As shown in FIGS. 1 to 3, a power supply structure 51 for feeding power to the IC chip 21 is provided in a plurality of positions in an outer circumference of the multilayer wiring board 10 (i.e., the positions corresponding to four corners of the element mounting portion 22). FIG. 2 is a plan view showing a multilayer wiring board 10 as seen from the top. FIG. 3 is a perspective view showing a power supply structure 51. For the sake of convenience, the solder resist 38 is omitted in FIG. 2.

The power supply structure 51 according to the embodiment is comprised of a conductive metal rod 52, a conductive metal tube 53 provided coaxially with the conductive metal rod 52 and an insulating material 54 which fills a gap between the conductive metal rod 52 and the conductive metal tube 53. The conductive metal rod 52 and the conductive metal tube 53 are mainly made of copper, and a nickel-gold plating is applied to the entire surface of the conductive metal rod 52 and the entire inner and outer surfaces of the conductive metal tube 53. The diameter of the power supply structure 51 according to the embodiment is about 1.5 mm smaller than that of the through hole conductor 16 (e.g., about 2 mm in diameter) of the core board 11. More particularly, the diameter of the conductive metal rod 52 is about 0.7 mm, and the thickness of the insulating material 54 is about 0.2 mm. The conductive metal tube 53 has an outer diameter of about 1.5 mm and about 0.2 mm in thickness. It is noted that the resistance of each conductive metal rod 52 and each conductive metal tube 53 according to the embodiment is 3 μohm/cm$^2$ or less, and has a lower resistance, at least, compared to that of the through hole conductor 16.

The power supply structure 51 is formed in such a manner that the conductive metal rod 52 is inserted in the conductive metal tube 53, and the insulating material 54 (e.g., an insulating resin material) is poured into the gap between the conductive metal rod 52 and the conductive metal tube 53 and thereafter hardened. The power supply structure 51 is embedded in a through hole 57 penetrating the core board 11 and the build up layers 31, 32, and fixed therein with an adhesive which is provided on the outer circumference face of the power supply structure 51.

A main surface side end portion of the conductive metal rod 52 of the power supply structure 51 is directly joined and electrically connected to the main surface side conductor layer 34 for the power supply (wiring pattern for the power). A rear surface side end portion of the conductive metal rod 52 is directly joined and electrically connected to a rear surface side conductor layer 42 for the power supply (wiring pattern for the power). A main surface side end portion of the conductive metal tube 53 of the power supply structure 51 is directly joined and electrically connected to the main surface side conductor layer 34 for the ground (wiring pattern for the ground). A rear surface side end portion of the conductive metal tube 53 is directly joined and electrically connected to the rear surface side conductor layer 42 for the ground (wiring pattern for the ground). The wiring pattern of the main surface side conductor layer 34 is connected to the IC chip 21 through the terminal pad 36 or the solder bump 20. The wiring pattern of the rear surface side conductor layer 42 is connected to the motherboard 47 through the BGA pads 44 or the solder bumps 48.

As shown in FIG. 3, the conductive metal tube 53 according to the embodiment has a notch 58 in both main surface side end portion and rear surface side end portion. The notch 58 has a width of about 0.7 mm and a height of about 0.4 m. The width of the notch 58 is much wider than the wiring pattern (e.g., 0.3 mm or less). The wiring pattern for the power supply is formed along an end face (upper and lower surfaces) of the insulating material 54 where the notch 58 is formed. Further, the conductive metal tube 53 has a tab-like pad portion 59 on both sides of the notch 58 in the main surface side end portion and the rear surface side end portion. The pad portion 59 has a width of about 0.4 mm wider than the wiring pattern. The wiring pattern for the ground is electrically connected to each pad portion 59.

As shown in FIG. 2, in the main surface side conductor layer 34, wiring patterns 341 for the ground connected to the conductive metal tube 53 are provided so as to sandwich therebetween a wiring pattern 342 for the power supply connected to the conductive metal rod 52, and are extended to the area where the element mounting portion 22 is formed.

Hereafter, a method for manufacturing the multilayer wiring board 10 will be described.

Figure 4:
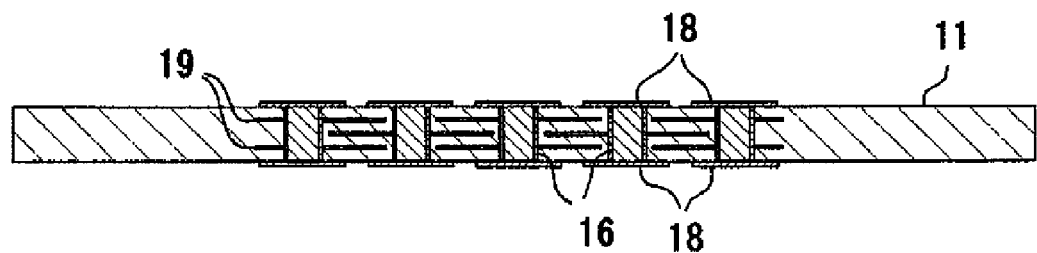
FIG. 4 is a sectional view showing a core board according to an embodiment of the invention.
Figure 5:
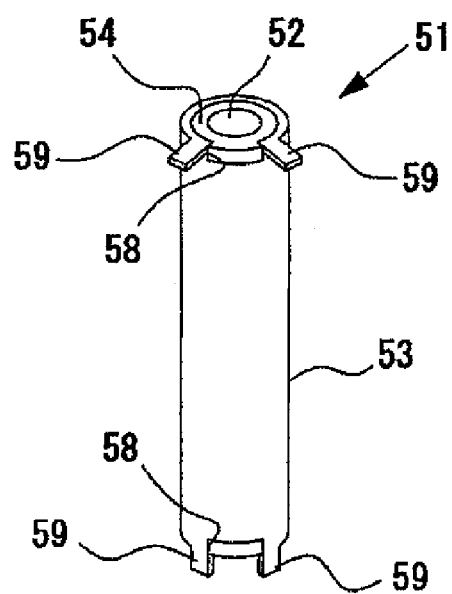
FIG. 5 is a perspective view showing a power supply structure according to an embodiment of the invention.

In a preparing step, the core board 11 having the through hole conductors 16 and the conductor layers 18, 19 (refer to FIG. 4) is produced by conventionally known techniques, and is prepared in advance. The double cylinder power supply structure 51 comprised of the conductive metal rod 52 and the conductive metal tube 53 (refer to FIG. 5) is produced, and is prepared in advance. However, in order to easily conduct an insertion to the through hole, only the pad portion 59 of the upper end portion of the conductive metal tube 53 is radially bent. On the other hand, the pad portion 59 of the lower end portion is not radially bent, but is extended in the axial direction.

Figure 6:
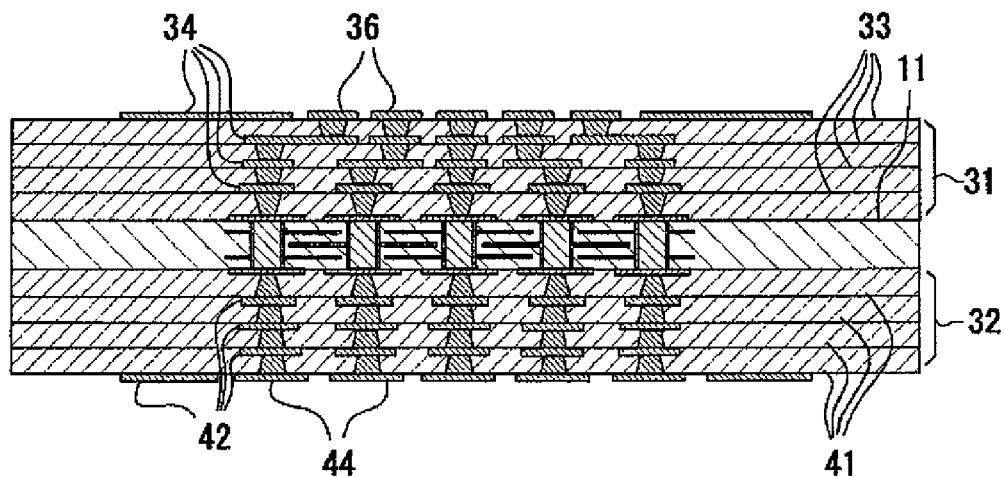
FIG. 6 is a sectional view explaining a method for manufacturing a multilayer wiring board according to an embodiment of the invention.

Then, in a build up layer formation step, the build up layer 31 in which the resin insulating layers 33 and the conductor layers 34 are alternately laminated is formed on the upper surface 12 of the core board 11 through conventionally known techniques. Further, the build up layer 32 in which the resin insulating layers 41 and the conductor layers 42 are alternately laminated is formed on the lower surface 13 of the core board 11 (refer to FIG. 6).

Figure 7:
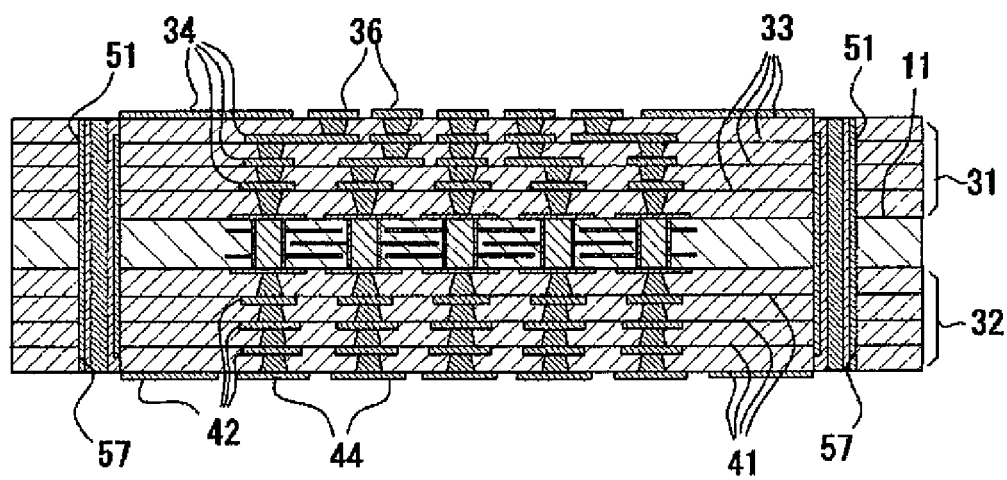
FIG. 7 is a sectional view explaining a method for manufacturing a multilayer wiring board according to an embodiment of the invention.

In an embedding step, the through hole 57 which penetrates the core board 11 and the build up layers 31, 32 is formed in a predetermined position by a laser or a drill processing. Thereafter, an adhesive is applied to the outer circumference face of the conductive metal tube 53 of the power supply structure 51, and the power supply structure 51 is embedded in the through hole 57 (refer to FIG. 7). At this time, the adhesive overflowed from the upper portion and the lower portion of the through hole 57 is wiped off. Thereafter, the adhesive is dried so as to fix the power supply structure 51 to the through hole 57, and the pad portion 59 of the lower end portion of the conductive metal tube 53 is radially bent outward.

Next, a solder paste or a conductive paste or the like is printed on the end portion of the conductive metal rod 52 and the pad portion 59 of the conductive metal tube 53 or the like, and is heated. With this process, while connecting the main surface side end portion and the rear surface side end portion of the conductive metal rod 52 to the wiring pattern for the power supply, the pad portion 59 of the main surface side end portion and the rear surface side end portion of the conductive metal tube 53 are connected to the wiring pattern for the ground.

Figure 8:
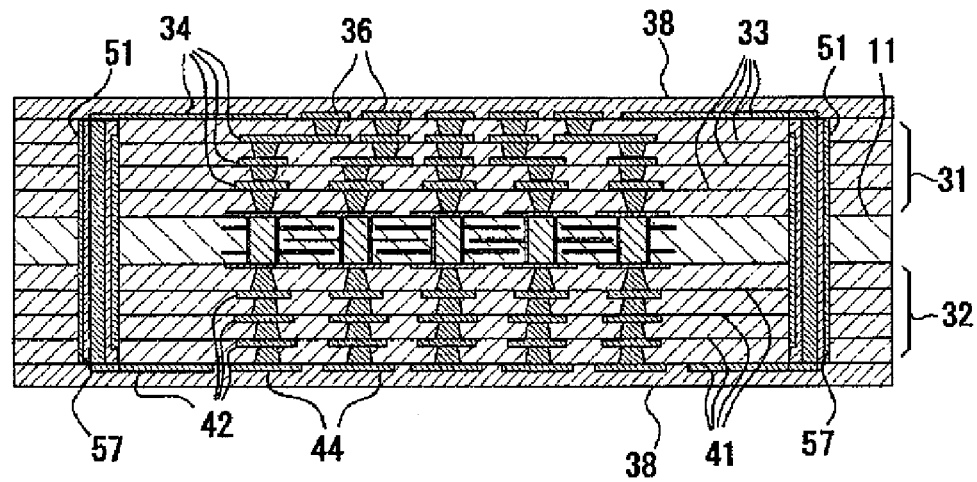
FIG. 8 is a sectional view explaining a method for manufacturing a multilayer wiring board according to an embodiment of the invention.
Figure 9:
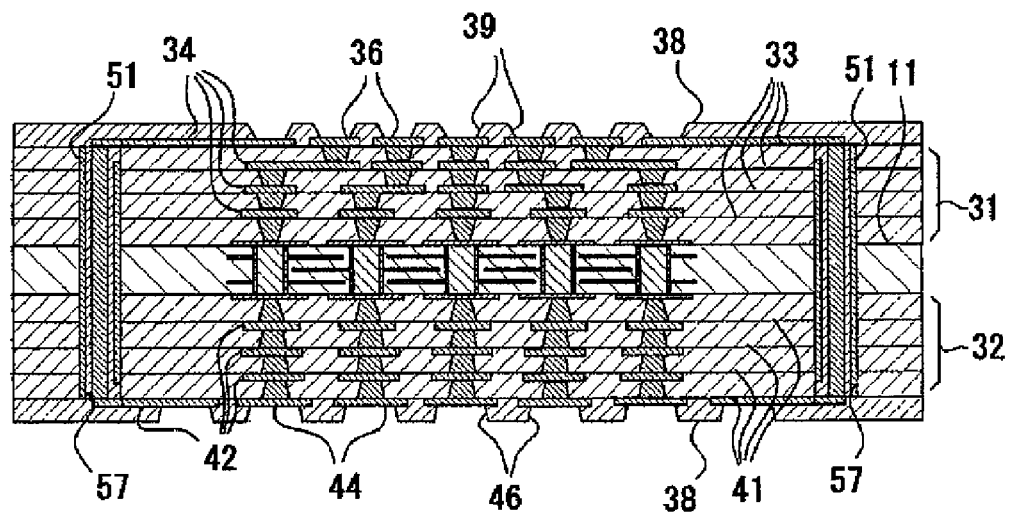
FIG. 9 is a sectional view explaining a method for manufacturing a multilayer wiring board according to an embodiment of the invention.

Thereafter, the solder resist 38 made of a resin insulating material is coated on the upper surface of the build up layer 31 and the lower surface of the build up layer 32 (refer to FIG. 8). More particularly, after applying the epoxy resin on the surfaces of the resin insulating layers 33, 41, the epoxy resin is allowed to cure at the temperature of about 180 degrees C. to 200 degrees C. for a predetermined period. The thus-heated epoxy resin is hardened to form the solder resist 38. Next, the openings 39, 46 are formed in the predetermined positions in the solder resist 38, i.e., the positions corresponding to the terminal pads 36 or the BGA pads 44, by a laser processing using a carbon dioxide gas laser (refer to FIG. 9).

Thereafter, the solder bumps 48 are formed respectively on the BGA pads 44 through printing the solder paste to the BGA pads 44 and reflowing the solder paste. As a result, the multilayer wiring board 10 comprised of the core board 11 and the build up layers 31, 32 is completed (refer to FIG. 1).

Thus, according to this embodiment, it is possible to obtain the following advantages.

(1) In the multilayer wiring board 10 according to the embodiment, the power supply structure 51 is embedded in the through hole 57 which penetrates the core board 11 and the build up layers 31, 32 so as to feed the power to the IC chip 21 via the power supply structure 51. The power supply structure 51 is comprised of conductive metal members (the conductive metal rod 52 and the conductive metal tube 53) made of copper as a main material and has a lower resistance compared to the conductive paste, whereby it is possible to feed high current. Thus, sufficient electric power can be supplied to the IC chip 21. Specifically, since the power supply structure 51 according to the embodiment has a smaller diameter than that of the through hole conductor 16 and is made of an excellent conductive metal member using copper, high current can be supplied without taking space. Unlike the through hole conductor 16, since the power supply structure 51 is not necessarily connected to the IC chip 21 through the via conductors 37, 45 of the build up layers 31, 32 and the conductor layers 36, 42, a connection resistance can be reduced, thereby improving the connection reliability of the multilayer wiring board 10.

(2) The power supply structure 51 according to the embodiment is comprised of the conductive metal rod 52, the conductive metal tube 53 formed coaxially with the conductive metal rod 52, and the insulating material 54 filling the gap between the conductive metal rod 52 and the conductive metal tube 53. Such a power supply structure 51 is capable of forming two power feed paths for the power supply and the ground whereby high current can be supplied.

(3) In the power supply structure 51 according to the embodiment, the conductive metal rod 52 is connected to the wiring pattern 342 for the power supply, and the conductive metal tube 53 is connected to the wiring pattern 341 for the ground. In this case, since the conductive metal rod 52 for the power supply is shielded by the conductive metal tube 53 for the ground, power-supply noise generated at the time of power feed can be reduced, and the IC chip 21 mounted on the element mounting portion 22 can be reliably operated. In the main surface side conductor layer 34, the wiring patterns 341 for the ground connected to the conductive metal tube 53 are provided so as to sandwich the wiring pattern 342 for the power supply connected to the conductive metal rod 52, and are extended to an area where the element mounting portion 22 is formed. Thus, the power-supply noise generated at the time of the power supply can be reliably reduced.

(4) In the power supply structure 51 according to this embodiment, the notch 58 is formed in the main surface side end portion and the rear surface side end portion of the conductive metal tube 53. The main surface side conductor layer 34 for the power supply and the wiring pattern 342 of the rear surface side conductor layer 42 for the power supply are laid in the location where the notch 58 is formed. With this composition, the wiring pattern 342 for the power supply is not in contact with the conductive metal tube 53 for the ground. Thus, the wiring pattern 342 can be reliably connected to the conductive metal rod 52 which is provided inside the conductive metal tube 53.

(5) The power supply structure 51 according to the embodiment is comprised of the tab-like pad portion 59 formed in the main surface side end portion and the rear surface side end portion of the conductive metal tube 53. The tab-like pad portion 59 is connected to the main surface side conductor layer 34 for the ground and the wiring patterns 341 of the rear surface side conductor layer 42 for the ground. With this composition, the wiring pattern 341 for the ground is easily and reliably connected to the conductive metal tube 53. When the power supply structure 51 is inserted in the through hole 57, the pad portion 59 of the conductive metal tube 53 is caught in the opening of the through hole 57 whereby the power supply structure 51 can be securely held. As a result, the connection reliability of the power supply structure 51 can improve.

(6) In the multilayer wiring board 10 according to the embodiment, the element mounting portion 22 is provided on the generally center area of the core board 11, and the power supply structure 51 is provided at plural positions in the outer circumference portion of the core board 11. Because the plural power supply structures 51 are provided, the power feed to the IC chip 21 can be reliably conducted. Further, since the power supply structure 51 is provided in a location where no element mounting portion 22 formed in the generally center of the core board 11 is provided, the area for the element mounting portion 22 is fully secured.

(7) In the multilayer wiring board 10 according to the embodiment, since a connecting portion between the power supply structure 51 and the main surface side conductor layer 34 and a connecting portion between the power supply structure 51 and the rear surface side conductor layer 42 are entirely covered with the solder resist 38, these connecting portions are prevented from forming a short-circuit with an external component or the like, thereby improving the reliability of the multilayer wiring board 10.

(8) In order to supply high current from one main surface to the other main surface of the multilayer wiring board 10, for example, a jumper wire can be used for the connection. However, the jumper wire does not usually pass through inside a wiring board, but is formed so as to largely bypass a wiring board external area. Thus, a wiring path is substantially long. Therefore, even though the jumper wire is made of a low resistance material, such as copper wire, reduction in resistance is not fully achieved. On the other hand, since the power supply structure 51 according to the embodiment is embedded in the wiring board, there is an advantage that the wiring path can be substantially short compared to the case where the jumper wire is used. Unlike the jumper wire, since the power supply structure 51 is not exposed outside, the excellent reliability of the multilayer wiring board 10 can be achieved.

Figure 10:
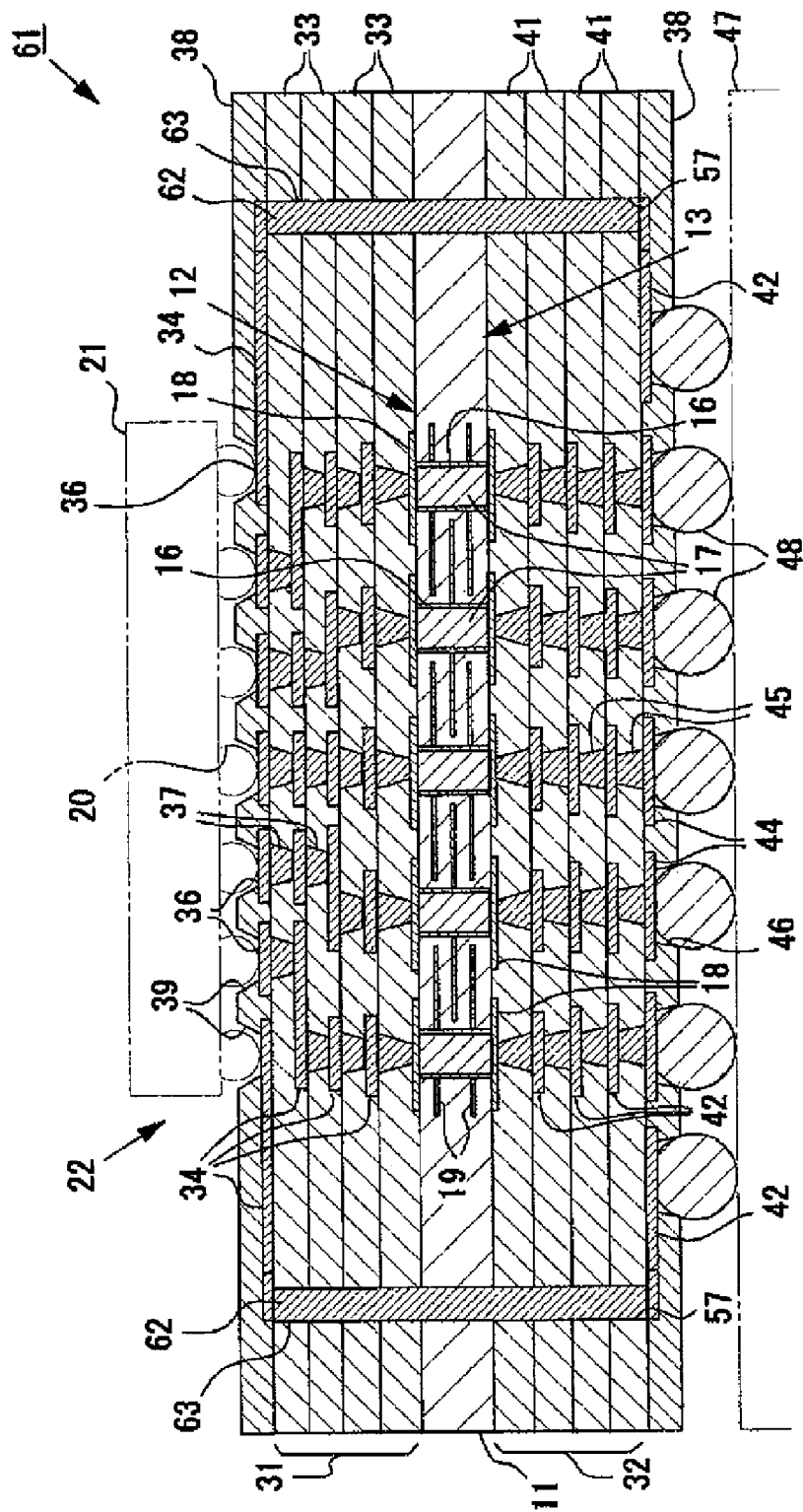
FIG. 10 is a schematic sectional view showing a multilayer wiring board of another embodiment of the invention.

The embodiment of the invention may be modified as follows. In the multilayer wiring board 10 according to the above-mentioned embodiment, the double cylinder power supply structure 51 having the conductive metal rod 52 and the conductive metal tube 53 which serves as the conductive metal member is used for feeding the power to the IC chip 21. However, in a multilayer wiring board 61 shown in FIG. 10, a power supply structure 63 only comprised of a conductive metal rod 62 can be used for feeding the power to the IC chip 21. The conductive metal rod 62 is made of copper as a main material, and the surface thereof is covered with a nickel-gold plating. The conductive metal rod 62 has a smaller diameter than that of the through hole conductor 16 of the core board 11. The power supply structure 63 is divided into one for the power supply and one for the ground. A main surface side end portion and a rear surface side end portion of the power supply structure 63 for the power supply are connected to a wiring pattern for the power supply. A main surface side end portion and a rear surface side end portion of the power supply structure 63 for the ground are connected to a wiring pattern for the ground. With this composition, the multilayer wiring board 61 can sufficiently feed high current to the IC chip 21.

Although the power supply structures 51, 63 of the above-mentioned embodiments have the conductive metal rods 52, 62, respectively, for example, a plate-like conductive metal member may be used instead. Further, although the entire surface of the power supply structure 51, 63 is covered with the plating, the plating may only be applied to the portions where the main surface side end portion and the rear surface side end portion are connected to the conductor layers 34, 42, respectively.

Figure 11:
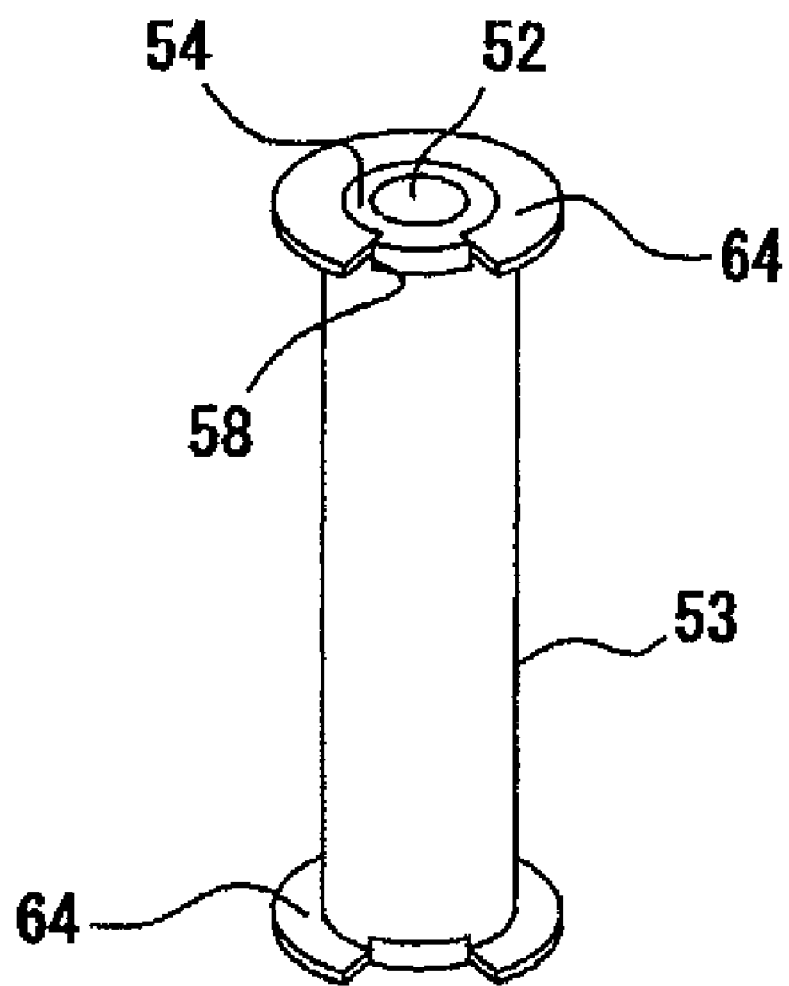
FIG. 11 is a sectional view showing a power supply structure of another embodiment of the invention.
Figure 12:
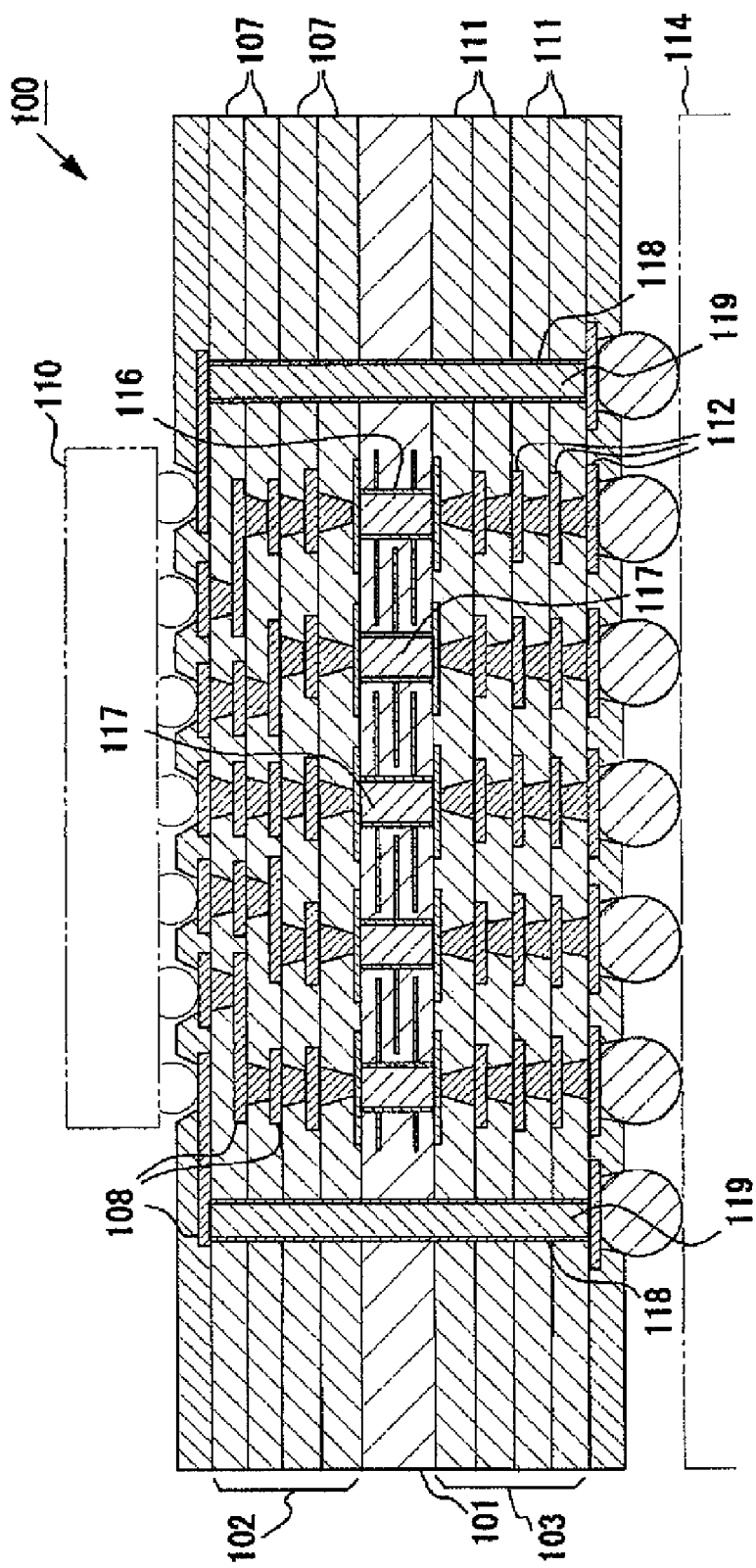
FIG. 12 is a schematic sectional view showing a conventional multilayer wiring board of the invention.

Although the power supply structure 51 of the above-mentioned embodiment has the tab-like pad portion 59 in the conductive metal tube 53, it may be modified to a flange-like pad portion 64 as shown in FIG. 11. When the conductive metal tube 53 is thick and as long as the connecting area to the wiring pattern can be fully secured, the pad portions 59, 64 of the conductive metal tubes 53 may be omitted. Of course, the pad portions 59, 64 may be provided only in either the main surface side end portion or the rear surface side end portion of the conductive metal tube 53.

In the above-mentioned embodiment, although the power supply structure 51, 63 is formed in the position where no through hole conductor 16 of the core board 11 is formed, the power supply structure 51, 63 may be formed so as to penetrate inside the through hole conductor 16. Since the through hole conductor 16 is filled with the relatively soft plugging body 17, the through hole 57 for embedding the power supply structure 51, 63 is easily formed. Further, when the power supply structure 51, 63 is fixed in the through hole conductor 16 using a conductive adhesive, a power feed capability of the power supply structure 51, 63 can be further improved.

In the above-mentioned embodiment, the power supply structure 51 is fixed to the through hole 57 using the adhesive, and thereafter, the pad portion 59 in the lower end of the conductive metal tube 53 is radially bent during the manufacturing process of the multilayer wiring board 10. However, it is not necessary to follow this manner of arrangement. For example, the diameter of the through hole 57 is enlarged so that the power supply structure 51 can be inserted therein in a state that the pad portion 59 in the conductive metal tube 53 is bent beforehand. Thereafter, the power supply structure 51 is fixed to the through hole 57 with an adhesive or the like.

In the above-mentioned embodiment, although the conductor layers 34, 42 of the build up layers 31, 32 are connected to the power supply structure 51 with a solder, they may be connected with copper plating. Further, the power supply structure 51 may be connected to the conductor layers 34, 42 with the jumper wire. Also, a process for connecting the conductor layers 34, 42 to the power supply structure 51 with the solder may be simultaneously conducted with a formation of the solder bumps 48 on the BGA pads 44. Furthermore, before forming the wiring patterns on the uppermost main surface side conductor layer 34 of the build up layer 31 and the lowermost rear surface side conductor layer 42 of the build up layer 32, the power supply structure 51 may be embedded in the through hole 57. Thereafter, the wiring pattern may be formed in the wiring pattern formation step so as to be connected to the power supply structure 51.

Although the power supply structure 51, 63 is provided in the position corresponding to the four corners of the element mounting portion 22 in the above-mentioned embodiment, the position to form the power supply structure 51, 63 and the number of the power supply structures 51, 63 are not limited. However, the power supply structure 51, 63 is preferably provided in an outer circumference portion of the multilayer wiring board 10, 61 where no element mounting portion 22 is provided.

In the above-mentioned embodiment, although the type of a package using the multilayer wiring board 10 is referred to a BGA (ball grid array), it may be, for example, a PGA (pin grid array), a LGA (land grid array) or the like.

The foregoing description discloses specific embodiments of the present invention. It should be appreciated that these embodiments are described for purposes of illustration only, and that numerous alterations and modifications may be practiced by those skilled in the art without departing from the spirit and scope of the invention. It is intended that all such modifications and alterations be included insofar as they come within the scope of the invention as disclosed herein, and as claimed or the equivalents thereof.

Having described the invention, the following is claimed:

1. A multilayer wiring board comprising:
   a core board having a main surface and a rear surface;
   a first laminated wiring portion having a structure in which a plurality of main surface side insulating layers and a plurality of main surface side conductor layers are alternately laminated on the main surface, and an element mounting portion is provided on a surface of the first laminated wiring portion;
   a second laminated wiring portion having a structure in which a plurality of rear surface side insulating layers and a plurality of rear surface side conductor layers are alternately laminated on the rear surface;
   a through hole conductor formed in the core board and electrically connecting a conductor layer formed on the main surface of the core board and a conductor layer formed on the rear surface of the core board; and
   a power supply structure comprised of a conductive metal rod made of copper as a main material and embedded in a through hole which penetrates the first laminated wiring portion, the core board and the second laminated wiring portion, wherein a main surface side end portion of the conductive metal rod is directly joined and electrically connected to a main surface side conductor layer for the power supply and a rear surface side end portion of the conductive metal rod is directly joined and electrically connected to a rear surface side conductor layer for the power supply, said main surface side conductor layer for the power supply is one of said plurality of main surface side conductor layers and said rear surface side conductor layer for the power supply is one of said plurality of rear surface side conductor layers.

2. A multilayer wiring board according to claim 1,
   wherein the power supply structure is further comprised of:
      a conductive metal tube provided coaxially with the conductive metal rod and made of copper as a main material; and
      an insulating material which fills a gap between the conductive metal rod and the conductive metal tube.

3. A multilayer wiring board according to claim 2,
   wherein a main surface side end portion of the conductive metal tube is electrically connected to a main surface side conductor layer for a ground and a rear surface side end portion of the conductive metal tube is electrically connected to a rear surface side conductor layer for the ground.

4. A multilayer wiring board according to claim 2,
   wherein the conductive metal tube has a notch formed at least in one of the main surface side end portion and the rear surface side end portion thereof, and
   wherein at least one of the main surface side conductor layer for the power supply and the rear surface side conductor layer for the power supply is laid in a location where the notch is formed.

5. A multilayer wiring board according to claim 2,
   wherein the conductive metal tube has a flange-like or a tab-like pad portion at least in one of the main surface side end portion and the rear surface side end portion thereof, and
   wherein the pad portion is electrically connected to at least one of the main surface side conductor layer for the ground and the rear surface side conductor layer for the ground.

6. A multilayer wiring board according to claim 1,
   wherein the element mounting portion is provided on a generally center of the core board, and the power supply structure is provided at plural locations in the outer circumference portion of the core board.

7. A multilayer wiring board according to claim 1, wherein resistance of the power supply structure is 3 $\mu$ohm/cm$^2$ or less.

8. A multilayer wiring board according to claim 1,
   wherein the power supply structure has a smaller diameter than that of the through hole conductor.

9. A multilayer wiring board according to claim 8,
   wherein the power supply structure is formed so as to penetrate the through hole conductor formed in the core board.

10. A multilayer wiring board according to claim 9,
    wherein the power supply structure is fixed using a conductive adhesive.

11. A multilayer wiring board according to claim 8,
    wherein the power supply structure is formed in a location where no through hole conductor formed in the core board is provided.

12. A multilayer wiring board according to claim 1,
    wherein the power supply structure is fixed using a conductive adhesive.

13. A multilayer wiring board according to claim 1,
    wherein the main surface side conductor layer for the ground forms a wiring pattern for the ground and the main surface side conductor layer for the power supply forms a wiring pattern for the power supply,
    wherein the wiring pattern for the ground is provided so as to sandwich the wiring pattern for the power supply and extended to an area where the element mounting portion is formed.

* * * * *